(12) United States Patent
Hogue et al.

(10) Patent No.: US 8,187,775 B2
(45) Date of Patent: May 29, 2012

(54) HIGH RESOLUTION PHOTOMASK

(75) Inventors: Eric L. Hogue, Galloway, OH (US); Timothy J. Stanfield, Lewis Center, OH (US)

(73) Assignee: Battelle Memorial Institute, Columbus, OH (US)

( * ) Notice: Subject to any disclaimer, the term of this patent is extended or adjusted under 35 U.S.C. 154(b) by 234 days.

(21) Appl. No.: 12/758,588

(22) Filed: Apr. 12, 2010

(65) Prior Publication Data

US 2010/0261098 A1 Oct. 14, 2010

Related U.S. Application Data

(60) Provisional application No. 61/168,670, filed on Apr. 13, 2009.

(51) Int. Cl.
*G03F 1/00* (2012.01)
*G03C 5/00* (2006.01)
(52) U.S. Cl. ............................................ 430/5; 430/394
(58) Field of Classification Search ................ 430/5, 30, 430/311–313, 322–324, 394
See application file for complete search history.

(56) References Cited

U.S. PATENT DOCUMENTS

| 7,626,185 B2 | 12/2009 | Krak et al. |
| 2004/0175656 A1 * | 9/2004 | Baer et al. ..................... 430/290 |

* cited by examiner

*Primary Examiner* — Stephen Rosasco
(74) *Attorney, Agent, or Firm* — Thomas E. Lees, LLC (57) ABSTRACT

A film photomask comprises a polymer substrate such as a photosensitive polymer than can be darkened. The photomask substrate is sensitive to light within a first wavelength range and is initially transparent to light within a second wavelength range that is utilized for product exposure operations to pattern a product using photomask. During a mask exposure operation, select regions of the photomask are exposed to light within the first wavelength range to selectively photodarken regions of the photomask substrate according to a desired pattern. The photodarkened regions are darkened sufficient to block light within the second wavelength range used for patterning a product through the photomask. Thus, no chemical processing is required to create a mask pattern. Moreover, the pattern is defined within/through the polymer material. The photomask may further comprise a filter that is applied to at least one side thereof for blocking light within the first wavelength range.

20 Claims, 6 Drawing Sheets

HIGH RESOLUTION PHOTOMASK

CROSS-REFERENCE TO RELATED APPLICATIONS

This application claims the benefit of U.S. Provisional Patent Application No. 61/168,670, entitled "HIGH RESOLUTION PHOTOMASK", filed Apr. 13, 2009, the disclosure of which is hereby incorporated by reference in its entirety.

BACKGROUND OF THE INVENTION

Various aspects of the present invention relate in general to contact photolithography, and in particular, to techniques for making high resolution photomasks for use with photolithographic processes.

In conventional photomask manufacturing, a rigid transparent substrate such as glass or quartz is coated with a thin film layer of chromium. To create a pattern in the photomask, a layer of photoresist material is deposited over the film layer of chromium. An exposure operation is then performed, whereby the photoresist material on the substrate is selectively exposed to light, e.g., from an ultraviolet (UV) source, according to the desired mask pattern. The photoresist material is photosensitive to the light utilized in the exposure operation, thereby altering the chemical resistance of the exposed regions of the photoresist material to a corresponding developer.

The mask pattern is subsequently developed in the photoresist material by using a liquid developer to remove portions of the photoresist material from the substrate, thus exposing the underlying film layer of chromium through the photoresist in a manner corresponding to the mask pattern. The exposed layer of chromium is then etched away from the transparent substrate using a wet chemical etchant. Finally, the photoresist remaining on the film of chromium is removed using solvents, resulting in a final mask product defined by areas of the mask that are opaque to light emitted by an ultra violet (UV) lamp utilized in a subsequent photolithographic process, and areas of the mask that are transparent to light from the UV lamp utilized in the subsequent photolithographic process.

As an alternative to the use of glass or quartz, the photomask substrate may comprise a polymer film, e.g., an acetate film, a Mylar film or other similar material. In a conventional film photomask process, a pattern is developed in an emulsion applied to the surface of the film using a suitable chemical developer. Additional processing may further be required to prepare the mask for use in its intended application. However, with such conventional film mask processing techniques, the resolution is limited. For example, current film photomasks used in photolithography processes are unable to resolve images less than 8-10 microns accurately or repeatedly. Thus the typical feature size is limited, and chemical processing is required to create a pattern over the surface of the film.

SUMMARY OF THE INVENTION

According to various aspects of the present invention, a method of making a high resolution photomask comprises providing a photomask substrate having a first major surface and a second major surface. The photomask substrate is sensitive to light within a first wavelength range that is utilized for mask exposure operations and is initially transparent to light within a second wavelength range that is utilized for product exposure operations required to pattern a product through the photomask. The method further comprises a mask exposure operation that includes exposing select regions of the first major surface of the photomask to light within at least the first wavelength range, e.g., using a mask exposure source, so as to selectively photodarken regions of the photomask substrate according to a desired pattern. The photodarkened regions are darkened sufficient to block light within the second wavelength range used for patterning products through the photomask.

The method still further comprises providing a filter associated with the second major surface of the photomask substrate. The filter is provided for allowing light within the second wavelength range to pass through, and for blocking block light within the first wavelength range, which is directed towards the second major surface, from causing photodarkening the photomask substrate. Thus, the filter is utilized for inhibiting or reducing the rate at which, light within at least the first wavelength range, which is directed towards the second major surface, causes photodarkening of the photomask substrate. The filter can be associated with the photomask either before or after the mask exposure operation. If the filter is associated with the second major surface of the photomask before the mask exposure operation, the photomask is oriented such that the photomask substrate is between the filter and the mask exposure source so that the filter does not interfere with the mask patterning process.

According to further aspects of the present invention, a high resolution photomask comprises a photomask substrate having a first major surface and a second major surface. The photomask substrate is sensitive to light within a first wavelength range that is utilized for mask exposure operations and is initially transparent to light within a second wavelength range that is utilized for product exposure operations required to pattern a product through the photomask. In this regard, exposure of select regions of the first major surface of the photomask to light within the first wavelength range, e.g., during a mask exposure operation, selectively photodarkens those regions of the photomask substrate. The photodarkened regions are darkened sufficient to block light within the second wavelength range used for patterning products through the photomask.

The photomask also comprises a filter associated with the second major surface of the photomask substrate. The filter allows light within the second wavelength range to pass through, and blocks light within the first wavelength range, which is directed towards the second major surface, from causing photodarkening of the photomask substrate. Thus, the filter is utilized to inhibit or otherwise reduce the rate at which light within at least the first wavelength range, which is directed towards the second major surface, causes photodarkening of the photomask substrate.

According to still further aspects of the present invention, a method of patterning a product using a high resolution photomask comprises providing a photomask substrate having a first major surface and a second major surface. The photomask substrate is sensitive to light within a first wavelength range that is utilized for mask exposure operations and is initially transparent to light within a second wavelength range that is utilized for product exposure operations required to pattern a product through the photomask. The method also comprises providing a filter associated with the second major surface of the photomask substrate. The filter blocks light within the first wavelength range, which is directed towards the second major surface, from causing photodarkening of the photomask substrate.

The method still further comprises performing a mask exposure operation by positioning a mask master having a master pattern, over the first major surface of the photomask such that the photomask substrate is between the mask master and the filter. The exposure operation also comprises exposing select regions of the first major surface of the photomask to light within at least the first wavelength range, through the mask master, using a mask exposure source. As such, the light of the exposure source selectively photodarkens regions of the photomask substrate according to the master pattern, where the photodarkened regions are darkened sufficient to block light within the second wavelength range used for patterning products.

The method still further comprises providing a layer of photoresist over a product to be patterned, aligning the photomask over the photoresist such that the first major surface of the photomask is between the filter of the photomask and the photoresist and exposing the photoresist on the product to be patterned to an exposure source that emits light within at least the second wavelength range, through the second major surface of the photomask, such that the filter of the photomask filters energy that would otherwise photodarken the sensitive regions the photomask. However, the filter allows light from the exposure source within the second wavelength range to pass through the second major surface of the photomask. The transparent, i.e., non-photodarkened, portions of the photomask are transmissive to the light within the second wavelength range to selectively expose corresponding portions of the photoresist on the product according to the pattern in the photomask. Further, the photodarkened portions of the photomask block light within the second wavelength range from exposing corresponding portions of the photoresist on the product to be patterned.

BRIEF DESCRIPTION OF THE SEVERAL VIEWS OF THE DRAWINGS

The following detailed description of various aspects of the present invention can be best understood when read in conjunction with the following drawings, where like structure is indicated with like reference numerals, and in which.

DETAILED DESCRIPTION OF THE INVENTION

According to various aspects of the present invention, methods of making a photomask are provided, which do not require chemical processing to create a pattern in the photomask. Moreover, such methods can resolve images down to sub-micron feature sizes. According to further aspects of the present invention, a photomask is provided, which comprises a filter. The filter is provided to filter specific wavelengths of light on at least one side of the photomask. In use, the filter enables a reduction of inherent clear-area darkening that can occur to transmissive regions of the photomask during use of the photomask to pattern products. The filter thus facilitate re-use of the same photomask multiple times in making patterned products, e.g., where the photomask would otherwise become unusable due to photodarkening of the clear areas because of wavelength sensitivities of the darkening additives.

According to still further aspects of the present invention, high resolution, e.g., sub-micron, photomask techniques are provided that utilize darkening and/or filtering capabilities, described more fully herein, to realize a patterned photomask. In this regard, manufacturing of the photomask does not require chemical processing. In an exemplary implementation, the photomask is manufactured using a film photosensitive polymer substrate that is stretchable. The film photosensitive polymer substrate may alternatively be flexible but not necessarily stretchable. Still further, the film photosensitive polymer substrate may alternatively be rigid.

Figure 1:
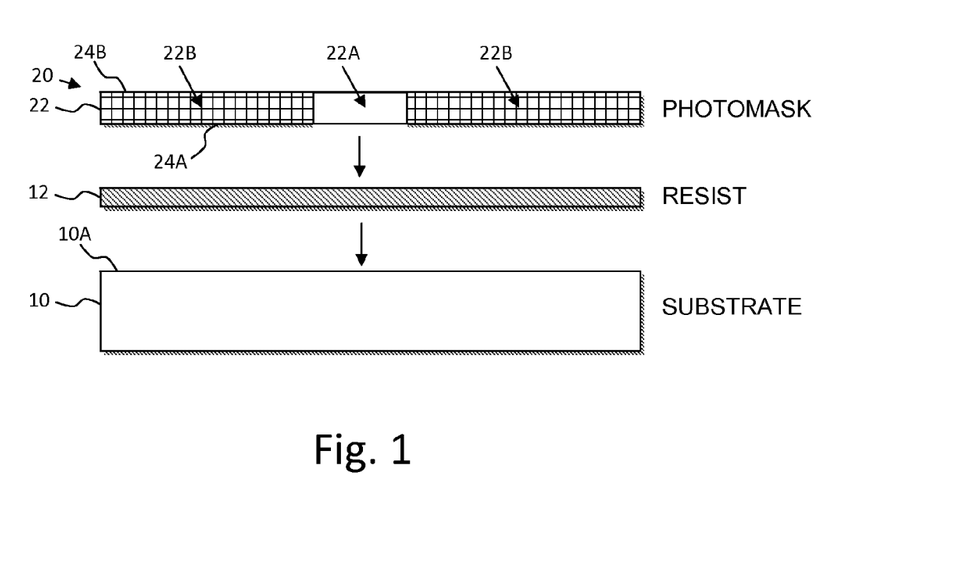
FIG. 1 is an illustration of a photolithographic process using a photomask for contact photolithography according to various aspects of the present invention.

Referring to FIG. 1, a process for making a patterned product comprises providing a substrate 10 to be patterned. The substrate 10 may in practice, comprise one or more layers, the particular composition of which will depend upon the corresponding application. A layer of photoresist 12 is provided over the substrate 10 adjacent to a surface 10A of the substrate 10 to be patterned.

A photomask 20 according to various aspects of the present invention, is positioned over the substrate 10 and the photoresist 12 for a product exposure operation. As will be described in greater detail herein, the photomask 20 comprises a substrate 22 that bears a pattern defined by transparent regions 22A, which are transparent at least to light within a wavelength range used for product exposure operations, and opaque regions 22B, which are opaque at least to light within the wavelength range used for product exposure operations. As such, during a product exposure operation, the photomask 20 enables selective exposure of the photoresist 12 on the substrate 10 in a pattern corresponding to the photomask pattern.

The opaque regions 22B are defined within and are otherwise integral with the photomask 20 such that no opaque layers are required to be formed on, deposited or otherwise laminated to, the surface of the photomask 20. In other words, the opaque regions 22B extend at least partially within the substrate 22 of the photomask 20 and no external layers are required to be built up on the photomask 20 to define the pattern. The transparent regions 22A allow light used for product exposure operations to pass entirely through the photomask 20, and thus selectively expose the photoresist 12. The exemplary implementation of the pattern illustrated in FIG. 1 is presented in a simple form for purposes of clarity of description. In practice, the pattern can comprise any arrangement of transparent regions and opaque regions, even where the feature size is reduced to less than 1 micron, according to various aspects of the present invention.

Figure 2:
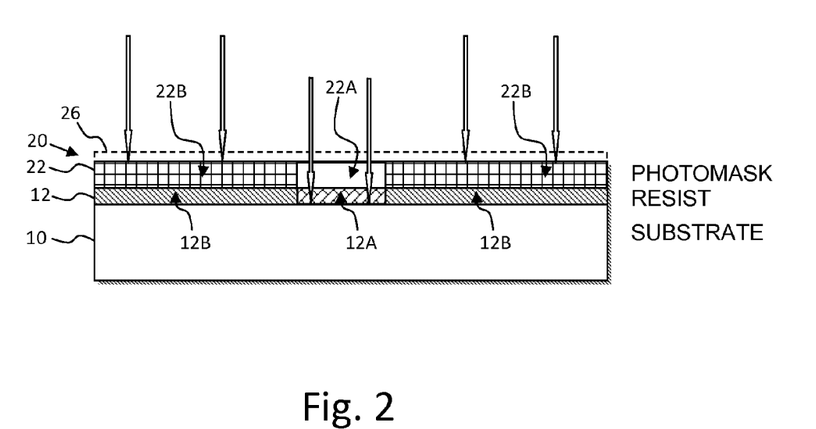
FIG. 2 is an illustration of a photomask according to various aspects of the present invention, positioned in contact with photoresist on a substrate for a contact photolithography operation according to various aspects of the present invention.

Referring to FIG. 2, during the patterning process for a contact lithography application, the photomask 20 may be brought into direct contact with the photoresist 12 and/or corresponding substrate 10. Collimated ultraviolet light (UV) light (schematically represented by the large, block arrows), is directed towards the substrate 10 through the photomask 20 and the photoresist 12. The UV light includes light within a wavelength range that corresponds with the properties of the photoresist 12 so as to alter the chemical resistance of the exposed regions of the photoresist 12 to a corresponding developer.

More particularly, the collimated UV exposure light passes through transparent regions 22A of the photomask 20, thus exposing regions 12A of the photoresist 12 that are in register with the corresponding transparent regions 22A of the photomask 20. Correspondingly, the collimated UV exposure light is blocked from exposing the regions 12B of the photoresist by opaque regions 22B of the photomask 20. As such, the exposed regions 12A of the photoresist 12 are schematically represented by different shading that the non-exposed regions 12B of the photoresist 12.

Rather than the pattern lying over a transparent surface of the photomask, the pattern is actually inside substrate 22 of the photomask 20. In this regard, the opaque regions 22B may reside mostly near the surface of the photomask 20 and thus do not need to go entirely through the photomask 20, e.g., so long as the opaque regions 22B block the exposure light. The integration of the pattern into the photomask itself may reduce some of the diffraction effects typically caused by the sharp edge of the typical surface pattern of a conventional photomask.

As used herein, the phrase "block the exposure light", or "block" in general, does not require a complete non-transmissive blockage of the light. Rather, the intensity of exposure light is either blocked entirely from reaching the photoresist 12, or the exposure light is reduced in intensity sufficiently to enable successful patterning in the photoresist 12. Thus for example, exposure light is suitably blocked if the contrast ratio of light blocked by the opaque regions 22B to the light transmissive through the transparent regions 22A is sufficient to copy the pattern from the photomask 20 to the photoresist 12.

After the product exposure operation, conventional processing of the substrate 10 can be carried out. For instance, in an exemplary implementation, the photomask 20 is removed from contact with the photoresist 12, and a development operation is performed to remove portions of the photoresist 12 from the surface of the substrate 10. In this regard, the development operation may remove the exposed regions 12A and leave the remaining regions 12B of photoresist, or the developer can leave the exposed regions 12A and remove the remaining regions 12B of the photoresist. The substrate 10 may be then be etched or otherwise processed to pattern the surface 10A of the substrate 10, e.g., to etch a conductive layer on the substrate 10.

According to exemplary implementations of the present invention, a photomask 20 comprises a photomask substrate 22 that contains photosensitive material(s). Alternatively, the photomask 20 may comprise a substrate material that has had photosensitive material(s) added thereto or otherwise integrated therewith so that the photosensitive material(s) penetrate the surface of the substrate. For instance, a photomask may be created by utilizing a polymer substrate to define the photomask substrate and by adding a photosensitive additive to the polymer substrate to enable the photomask to photodarken in response to exposure by the light in the first wavelength range. As an additional example, a photosensitive additive can be added to or otherwise integrated with the substrate material, e.g., during a process that forms the substrate for use as a photomask, where the additive causes select areas of the substrate to photodarken, thus turning opaque when exposed to a specific wavelength range of light, such as a particular wavelength or wavelength range of UV light.

In an exemplary implementation, the photomask substrate 22 is sensitive to light within a first wavelength range that is utilized for mask exposure operations and initially transparent to light within at least a second wavelength range that is utilized for product exposure operations required to pattern a product through the photomask 20. As illustrated, the substrate of the photomask 20 includes a first major surface 24A and a second major surface 24B. Thus, exposure of select regions of the surface of the photomask substrate, e.g., exposure of select regions of the first major surface 24A of the photomask 20, to light from a light source having light within the first wavelength range selectively photodarkens regions of the photomask substrate 22 to define the opaque regions 22B corresponding to a desired pattern. The photodarkened regions, i.e., opaque regions 22B, are darkened sufficient to block light within the second wavelength range, which is utilized to pattern the photoresist 12. Correspondingly, the transparent regions 22A enable light within the second wavelength range to pass through with sufficient intensity to perform a patterning operation, e.g., to pattern underlying photoresist.

The phrase "turns opaque" means that the photosensitive material exhibits a change in transmittance in areas exposed to light of a determined wavelength range associated with the specific photosensitive material, which causes the exposed material to darken at least such a contrast ratio between unexposed areas, i.e., transparent regions 22A and exposed areas, i.e., opaque regions 22B, is suitable to pattern features on a substrate such as photoresist 12, etc., that is sensitive to an exposure source. Thus, the opaque regions 22B can "block", e.g., inhibit or otherwise reduce the rate at which light from the determined wavelength range, is transmitted there through, at least sufficiently for patterning during product exposure operations, as described in greater detail herein.

In practice, the wavelength range necessary to either photodarken the opaque regions 22B of the photomask and/or the wavelength range necessary to pattern the photoresist 12 can reside in a single wavelength value, or a wavelength range can comprehend two or more, e.g., a plurality of wavelength values, such as may be emitted by a particular electromagnetic radiation source.

In an illustrative implementation, the photomask 20 comprises a polymer film such as a film photosensitive polymer substrate that is stretchable and/or deformable. Thus, the polymer film photomask 20 according to this exemplary implementation of the present invention, can be stretched, e.g., sufficiently to be formed around complex curved substrates to be patterned using contact photolithography processes using the photomask 20.

In another illustrative implementation, the photomask 20 comprises a polymer film such as a photosensitive polymer film substrate that is flexible. That is, the film may flex, but will not substantially stretch or otherwise deform. For example, a flexible photomask substrate may be utilized to simulate the mechanical performance of conventional film masks, e.g., made of polyethylene terephthalate (PET), but allow for the higher resolution capabilities of the stretchable photomask technology and chemical-free processing described more fully herein.

In yet another illustrative implementation, the photomask 20 comprises a rigid photosensitive substrate. For instance, the photomask 20 may comprise a photosensitive substrate incorporated with a rigid polymer, glass, rigid plastic or other rigid substrate. In this exemplary implementation, the rigid photomask 20 is suitable for standard contact lithography processes and is particularly suited to simulate the rigidity of a glass photomask but allow for the higher resolution capabilities of the photomask technology and chemical free processing described more fully herein. Rigid photomasks 20 according to various aspects of the present invention, can thus be used in existing applications where glass photomasks are typically used, such as in mask aligners for contact lithography. By way of illustration, the rigid photomask 20 can be utilized for applications where precise and/or specific alignment of one or more features is required with respect to the product to be patterned using the photomask 20. Moreover, the rigid photosensitive photomask 20 is suitable for applications where a flexible or stretchable photomask may stretch too easily, or where a flexible or stretchable photomask is difficult to use in precise alignment of the photomask to the product to be patterned.

Moreover, such photomasks 20 reduce the possibility of damaging substrates 10 when particulate contamination is trapped between the photomask and the substrate. Still further, rigid polymer photomasks 20 according to various aspects of the present invention would not shatter as may occur with conventional glass photomasks if the photomask is dropped or improperly handled.

According to various aspects of the present invention, the wavelengths of the UV light used to pattern the photoresist 12 during a product exposure operation can be sufficiently different from the wavelength range of light used for mask exposure operations so that product exposure operations do not cause significant corresponding photodarkening of the photomask substrate 20.

Alternatively, the wavelength ranges utilized for mask exposure operations and for product exposure operations may overlap. That is, depending upon the specific implementation, a photosensitive additive utilized to create the photosensitive capabilities of the photomask substrate may darken with UV exposure of specific wavelengths of light utilized for exposure operations when using the photomask to pattern products. As such, the areas of the pattern within the photomask 20 that are intended to define clear areas, e.g., transparent regions 22A, may darken during use of the photomask 20 for photolithographic operations. Thus for example, where the wavelength range required for photolithographic operations of the product overlap with the specific wavelength range that darkens the photomask 20, the photomask 20 may have a limited number of uses and still allow the proper contrast between the transparent regions 22A and the opaque regions 22B.

Figure 3:
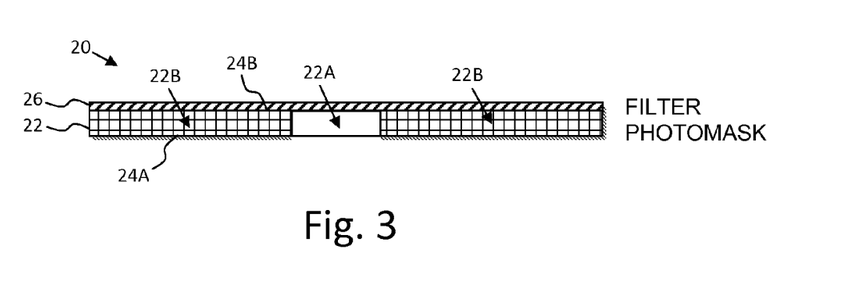
FIG. 3 is an illustration of a photomask including a filter according to various aspects of the present invention.

Referring to FIGS. 2 and 3, according to further aspects of the present invention, exemplary implementations of the photomask 20 include a filter 26 associated with the second major surface 24B of the photomask substrate. The filter 26 is provided for blocking light directed towards the second major surface 24B of the photomask 20 from causing undesired or unintentional photodarkening of the photomask substrate. In this regard, "block" or "blocking" light by the filter 26 means that the filter 26 inhibits or otherwise reduces the rate at which light causes photodarkening of the photomask substrate. However, the filter 26 allows light within the wavelength range used for patterning products to pass through, as will be described in greater detail herein.

In general, according to certain aspects of the present invention, the photomask 20 comprises a film containing a photosensitive polymer than can be darkened using specific wavelengths of light, as described in greater detail herein. However, the filter 26 is configured to block light within the specific wavelengths that photodarken the photosensitive polymer. As such, the inclusion of the filter 26 provides a photomask 20 than can be darkened using specific wavelengths of light directed towards one side of the film, i.e., the side opposite the filter 26.

When the photomask 20 is utilized to pattern products, the filter side of the photomask 20 is oriented towards the exposure source. Light within a wavelength range utilized in the product exposure operation will pass through the filter 26. Moreover, the light that passes through the filter 26 will be transmitted through the transparent regions 22A of the photomask and will be blocked by the opaque regions 22B of the photomask 20. As such, the filter 26 is utilized to filter out the wavelengths that darken the film itself while allowing wavelengths that expose the photoresist on the product to be patterned, to pass through.

In an exemplary implementation, the photomask 20 is implemented utilizing a photosensitive polymer film material and the filter 26 is applied to the polymer film so as to be an integral part thereof, i.e., not a separate layer built up on the surface of the polymer film. In this regard, the filter 26 may comprise a filtering additive applied to at least one side of the polymer film material. The filtering additive filters out wavelengths of light that cause the film material to photodarken. However, the filter 26 need not necessarily be part of the photosensitive polymer. For instance, according to further aspects of the present invention, the filter 26 may be a totally separate material, e.g., applied as a laminate to the photomask 20. In this regard, the filter 26, regardless of being implemented inside the film material, or as a laminate, layer other structure, filters out wavelengths of light that cause the photomask to photodarken.

The photomask 20 comprises photosensitive material according to aspects of the present invention, that darkens based upon exposure to ultraviolet (UV) illumination. As such, no chemical developing or etching is required to create a photomask using the materials and techniques described more fully herein. Still further, sub-micron features may be realized within the film according to various aspects of the present invention, which far outperforms existing film photomask solutions. In this regard, photomasks according to the present invention may utilize techniques and processes as described in U.S. patent application Ser. No. 11/837,253, entitled "PATTERNING NON-PLANAR SURFACES", and U.S. patent application Ser. No. 11/836,481, entitled "PATTERNING COMPOSITIONS, MASKS, AND METHODS" which are incorporated by reference herein in its entirety.

Exemplary Approaches For Making a Photomask

Figure 4:
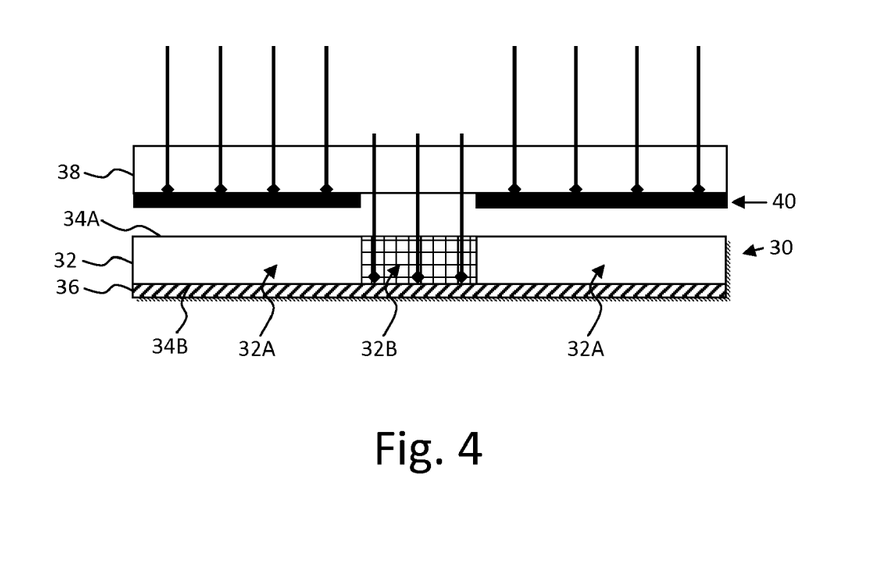
FIG. 4 is an illustration of using a glass master to pattern a photomask according to various aspects of the present invention.

Referring to FIG. 4, a photomask 30 according to further aspects of the present invention comprises a substrate 32, such as a UV sensitive material, having a first major surface 34A and a second major surface 34B. The photomask 30 also comprises a filter 36 that is provided on or is otherwise integral with the second major surface 34B.

The photomask substrate 32 is sensitive to light within a first wavelength range that is utilized for mask exposure operations and is initially transparent to light within a second wavelength range that is utilized for product exposure operations required to pattern a product through the photomask 30. Exposure of select regions of the first major surface 34A of the photomask 30 to light from a light source having light in at least the first wavelength range selectively photodarkens regions of the photomask substrate according to a desired pattern sufficient to block light within the second wavelength range. In this regard, the photomask 30 is analogous to the photomask 20 described more fully with reference to FIGS. 1, 2 and 3. Similarly, the filter 36 is analogous to the filter 26 described with reference to FIGS. 2 and 3.

As noted in greater detail herein, the filter 36 can be a filtering additive applied to at least one side of the UV sensitive material, e.g., so as to form a filter on the surface of the substrate 32 and/or to form a filter that permeates into the substrate 32 such that a wavelength filtering layer is included in the substrate of the photomask structure itself, e.g., in the UV sensitive material. The filter 36 generally does not permeate entirely through the UV sensitive material 32 however. According to alternative aspects of the present invention, the filter 36 may be implemented as a layer that is laminated to the substrate 32, in a manner analogous to the filter 26 described more fully herein. Thus, for instance, the filter 36 is adjacent to only a single major surface of the material 32 such that there is a "filter side" and a "non-filter side". In the illustrative example, non-filter side corresponds with major surface 34A and the filter side is associated with the second major surface 34B of the photomask 30.

Moreover, the filter 36 of the photomask 30 extends so as to cover the areas defined at least by the clear regions, i.e., the regions that are transparent to the exposure source utilized for patterning products. In a manner analogous to that described with reference to FIG. 3, the filter 36 prevents or otherwise reduces the effect of the transparent regions of the photomask 30 from photodarkening in response to the utilization of the photomask 30 for patterning products. For instance, the filter 36 may block light in at least a first wavelength range, which is directed towards the second major surface 34B, from causing photodarkening of the photomask substrate 32. Thus, the filter 36 may inhibit or otherwise reduce the rate at which light within at least the first wavelength range, which is directed towards the second major surface 34B, causes photodarkening within the photomask substrate 32.

As illustrated, a mask master 38, e.g., a chrome on glass photomask master, is oriented above non-filter side, e.g., the first major surface 34A defining a UV sensitive side of the photomask 30, as illustrated. The mask master 38 has a master pattern 40 on the surface thereof. Exposure energy, such as UV illumination from a light source having light in at least the first wavelength range, is utilized to pattern the photomask 30 through the corresponding pattern 40, which is formed by the chrome on the glass of the photomask master 38 in the illustrative example. As schematically illustrated, the arrows with the diamond shaped heads represent light within a the first wavelength range.

In this regard, the UV sensitive material 32 is between the chrome pattern 40 on glass photomask master 38 and the filter 36 of the photomask 30 so that the desired pattern is formed within the UV sensitive material 32 of the photomask 30. Thus, in the illustrative example, the filter 36 is oriented below the UV sensitive substrate 32 and the photomask 30 is patterned from above via the mask master 38.

Any number of techniques can be utilized for patterning the photomask, further examples of which are set out in greater detail in U.S. patent application Ser. No. 11/837,253, entitled "PATTERNING NON-PLANAR SURFACES", and U.S. patent application Ser. No. 11/836,481, entitled "PATTERNING COMPOSITIONS, MASKS, AND METHODS", the disclosures of which have already been incorporated by reference herein.

Figure 5:
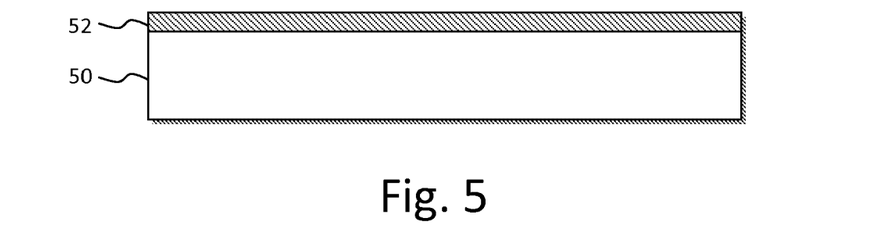
FIG. 5 is an illustration of a product to be patterned, which is covered with photoresist on a top surface thereof.

Referring to FIG. 5, a product 50 to be patterned is coated with a photoresist 52. The product 50 can comprise a simple shape, or the product 50 can have a complex surface, e.g., including complex curves or other two or three dimensional profiles. Regardless of surface profile, a layer of photoresist 52 is formed over the surface of the product 50 to be patterned.

Figure 6:
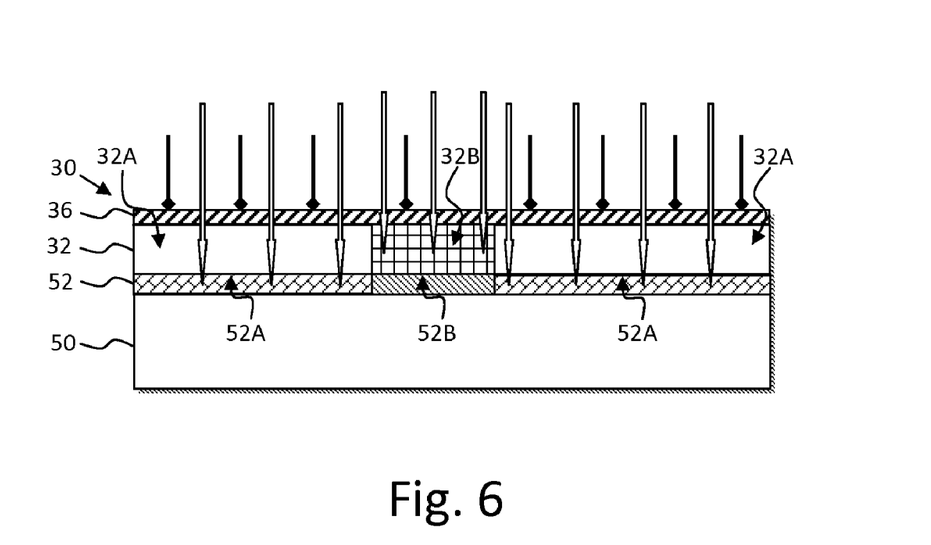
FIG. 6 is an illustration of using the photomask of FIG. 4 to pattern a product, according to various aspects of the present invention.

Referring to FIG. 6, when the photomask 30 is patterned, e.g., as described with reference to FIG. 4, the photomask 30 includes a pattern that is formed in the UV sensitive substrate 32 itself. For example, the illustrated photomask 30 includes two outer clear regions 32A that are transparent to light of a corresponding exposure source, e.g., at a second wavelength range utilized to pattern the photoresist 52. Correspondingly, the photomask 30 includes an opaque region 30B that is opaque to light of a corresponding exposure source, e.g., at a second wavelength range utilized to pattern the photoresist 52 as described more fully herein.

The exemplary implementation of the pattern illustrated in FIG. 6 is presented in a simple form for purposes of illustration and clarity of description. In practice, the pattern can comprise any arrangement of transparent regions and opaque regions, even where the feature size is reduced to less than 1 micron.

Referring to FIGS. 4 and 6, when using the photomask 30 for photolithography operations, e.g., to pattern a product 50 having a layer of photoresist 52 thereon, the photomask 30 is "flipped" such that the filter 36 is oriented between the exposure source and the photomask 30. In this regard, the filter 36 of the photomask 30 filters certain wavelengths of the exposure energy, e.g., light at a wavelength that would otherwise tend to photodarken the clear regions 32A in the UV material 32. In the illustrative example, the filter 36 filters light within the first wavelength range. Moreover, the filter 36 passes exposure energy within other, non-filtered wavelengths, e.g., wavelengths that are suitable for patterning a product through the photomask 30. Again, keeping with the current example, the filter 36 passes exposure energy within the second wavelength range. Moreover, light within the second wavelength range passes through the clear regions 32A of the photomask 30 so as to expose photoresist 52 on the surface of the product 50 to be patterned using the photomask 30.

As schematically illustrated, the arrows with the diamond shaped heads represent light within a wavelength range that is filtered by the filter 36, e.g., light within the first wavelength range that would otherwise cause photodarkening of the photomask 30. Correspondingly, light within another wavelength range, e.g., light within the second wavelength range, penetrates the filter 36, as represented by the block arrows. Note that the block arrows, representing light within the second wavelength used for product exposure operations, pass through the filter 36, but are blocked by the opaque regions 32B of the photomask 30. Correspondingly, the block arrows pass through the filter 36 and the transparent regions 32A of the substrate 32. In this regard, light in the exposure wavelength range required by the photoresist 52 passes through the photomask 30 with sufficient energy to alter the properties of the underlying photoresist 52, as schematically designated by the change to the pattern fill of the photoresist layer 52 in register with the transparent regions 32A.

In this regard, by including the filter 36 on at least one side of the photomask 30, which filters out the wavelengths that darken the wavelength sensitive substrate 32 as schematically illustrated by the lines with diamond arrowheads, the photomask 30 may be used multiple times with little or no darkening of the clear regions within the UV sensitive substrate 32 of the photomask 30.

After exposure, the product may be processed using any desired processing techniques. As a few illustrative examples, a development process may be performed to remove the photoresist 52 in one of the exposed or unexposed regions of the photoresist 52, e.g., using conventional techniques. For example, the product may be baked during a post exposure bake. Once the product has been (optionally) baked and is cool, the product may be developed. Once developed, additional processing steps may be performed as the specific application dictates.

In a first illustrative example, if a conductive pattern is to be applied to the product via a lift off technique, the product is then conformally coated with a conductive material. Where the photoresist has been removed, the conductive material will contact the product. Alternatively, the conductive layer will form above the photoresist that remains on the product. Moreover, a thin steep wall of conductive material will form between the layer of conductive material on the photoresist and the layer of conductive material on the surface of the product. Depending on the uniformity requirements and the geometry of the product, tooling and rotation schemes may be needed to suitably coat the product.

A lift off operation is then performed to remove the remaining photoresist from the product, and hence the conductive material on the photoresist. When the photoresist is removed, e.g., by spraying or submerging the product with a suitable solvent solution, the thin, steep walls of conductive material will break, releasing the remaining photoresist and corresponding conductive material that was layered over the photoresist. However, the conductive material applied to the surface of the product remains adhered to the product.

As an illustrative alternative to the lift off technique, an etch process may be utilized, e.g., by applying a conductive coating to the product before applying the photoresist to the product. In this example, after developing the photoresist, a conventional etch process may be utilized to etch away the conductive material exposed after developing the photoresist. As yet a further example, processing may comprise any type of treatment that could be selectively applied to the substrate corresponding to the photoresist pattern. Additional exemplary processes could include wet etching such as with HF, dry etching such as with RIE or a ion implantation where the substrate is modified by the addition of other materials into the substrate.

Figure 7:
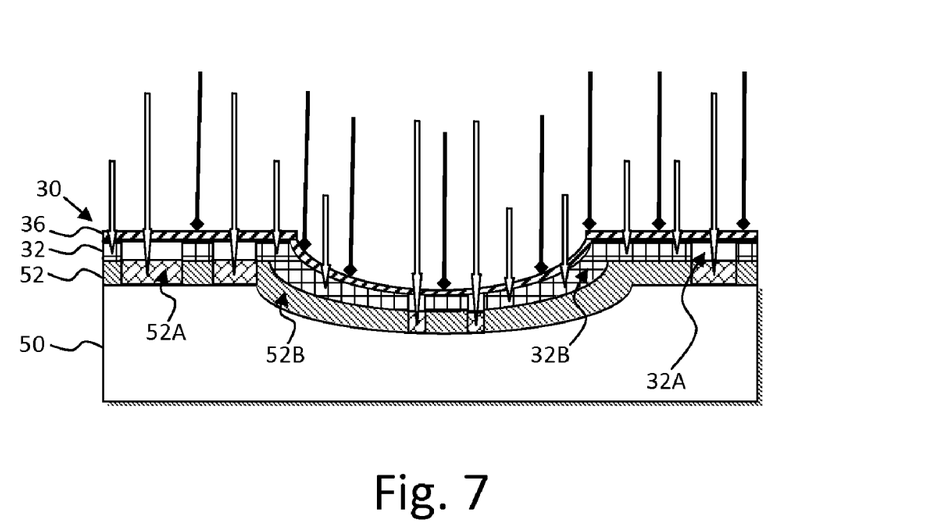
FIG. 7 is an illustration of a photomask utilized in patterning a product having a complex curved surface, according to aspects of the present invention.

Referring to FIG. 7, the description is analogous to that described above with reference to FIGS. 4-6. In the exemplary illustration of FIG. 7 however, the photomask 30 is utilized for contact lithography with a product 50 having a complex curved surface. In this regard, the photomask substrate 32 may be required to stretch to conform to the complex curved surface. Alternatively, stretching of the photomask substrate 32 may be undesirable, e.g., for applications where specific alignment of features is required. In this regard, the photomask substrate 32 may be flexible but not stretchable, e.g., to simulate the mechanical performance of PET film and/or the photomask substrate 30 may be rigid, e.g., simulating the rigidity of glass, thus replacing a conventional glass photomask. In this regard, the photomask 30 is shaped to conform to the surface of the product 50 to be patterned.

Figure 8:
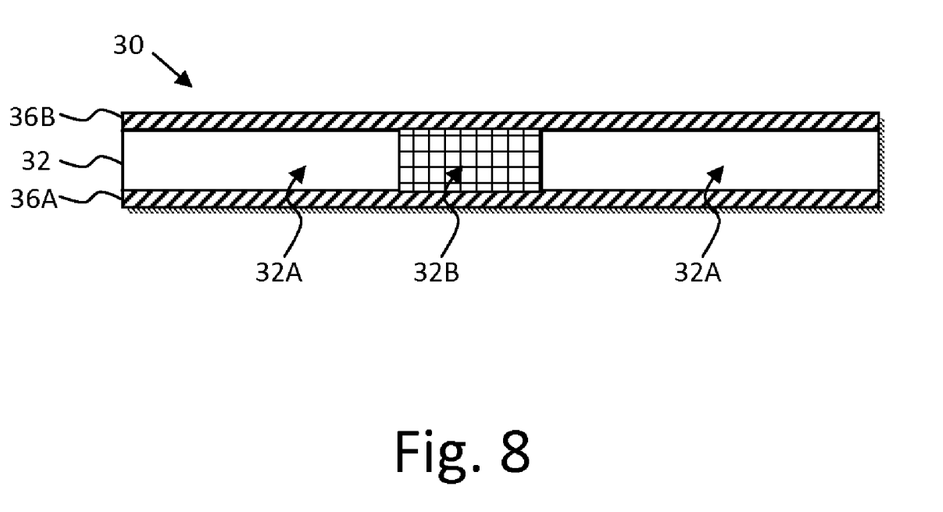
FIG. 8 is an illustration of a photomask having a filter on each major surface, according to various aspects of the present invention.

Referring to FIG. 8, according to still further aspects of the present invention, a second filter is added to the photomask 30, thus defining a first filter 36A and a second filter 36B, each on opposite sides of the substrate 32. The second filter 36B may be added to the substrate 32, for example, after the pattern has been darkened into the film material during a mask exposure operation. The second filter 36B may also be added before using the photomask 30 to pattern a product. In this regard, a filtering layer is present on both sides of the photomask 30. This arrangement reduces the possibility of the photomask 30 being inadvertently exposed from the wrong side, thus being unintentionally darkened. This additional layer provided by filter 36B could also be used as a protective layer to prevent damage or contamination.

Figure 9:
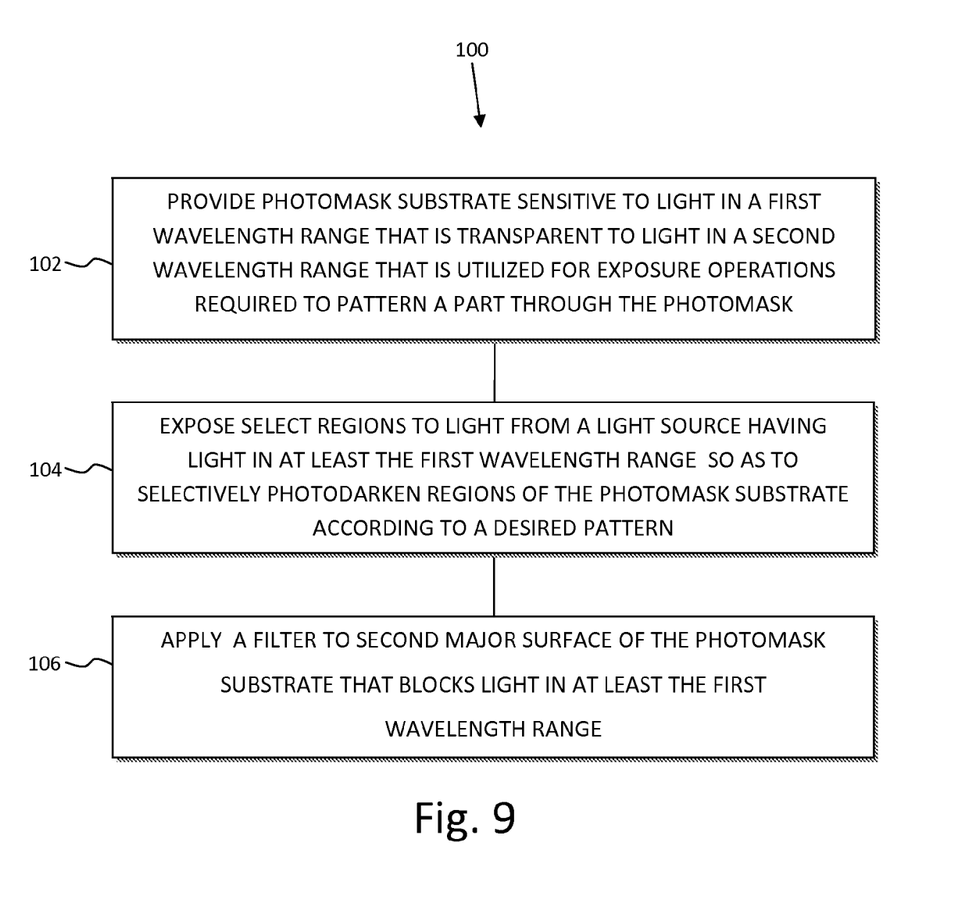
FIG. 9 is a flow chart of a method for making a mask according to aspects of the present invention.

Referring to FIG. 9, a method 100 of making a high resolution photomask comprises providing at 102, a photomask substrate, e.g., a photosensitive polymer, having a first major surface and a second major surface. The photomask substrate is sensitive to light in a first wavelength range that is utilized for mask exposure operations, e.g., a particular wavelength range of UV light, and is initially transparent to light in a second wavelength range that is utilized for product exposure operations required to pattern a product through the photomask. As noted above, the photosensitive polymer may comprise a polymer substrate where a photosensitive additive has been added to the polymer substrate to enable the photomask to photodarken in response to exposure by the light in the first wavelength range.

The method 100 also comprises exposing select regions of the first major surface of the photomask to light from a light source having light in at least the first wavelength range so as to selectively photodarken regions of the photomask substrate according to a desired pattern at 104. In this regard, the photodarkened regions are darkened internal to the photomask substrate sufficient to block light in the second wavelength range.

The method 100 still further comprises providing a filter associated with the second major surface of the photomask substrate at 106. The filter performs at least one of: entirely blocking light in at least the first wavelength range, which is directed towards the second major surface, from causing photodarkening of the photomask substrate, and reducing the rate at which light, in at least the first wavelength range, which is directed towards the second major surface, causes photodarkening within the photomask substrate. The filter may be implemented, for example, by applying a filtering additive to the second major surface of the photomask substrate to filter out the wavelengths of light that cause the photomask substrate to photodarken. The filter further allows light within the second wavelength range, to pass through.

In an illustrative implementation, a mask master is utilized to define the pattern on the photomask by aligning the mask master with the first major surface of the photomask so that sensitive substrate regions are between the mask master and the filter associated with the second major surface of the photomask substrate. For instance, the mask master can be positioned over the first major surface of the photomask such that the photomask substrate is between the mask master and the filter. A light source is utilized to emit light at least in the first wavelength range through the mask master to selectively define the pattern in the photomask, e.g., by selectively photodarkening regions of the photomask substrate according to the mask master pattern, where the photodarkened regions darkened sufficient to block light in the second wavelength range from passing through the photomask.

A second filter may then optionally be provided. For instance, a filter may be associated with the first major surface, e.g., after exposing the select regions of the first major surface of the photomask to the light source at the first wavelength range. The second filter is provided for inhibiting or otherwise reducing the rate at which light in the first wavelength range, which is directed towards the first major surface, causes photodarkening of the photomask substrate. For example, the second filter may be provided using a filtering additive to filter out the wavelengths of light that cause the photomask substrate to photodarken, as described more fully herein.

To pattern a product, a layer of photoresist is provided over a product to be patterned and the photomask is aligned over the photoresist such that the first major surface of the photomask is between the filter of the photomask and the photoresist over the product to be patterned. The photoresist is exposed to an exposure source that emits light in at least the second wavelength range, through the second major surface of the photomask. In this regard, the filter of the photomask filters energy that would otherwise photodarken the sensitive regions the photomask. Moreover, the filter allows at least the second wavelength range of light from the exposure source to pass through the second major surface of the photomask, as described in greater detail herein. Additionally, the non-photodarkened portions of the photomask are transmissive to light within the second wavelength range so as to selectively expose corresponding portions of the photoresist on the product according to the pattern in the photomask. Still further, the photodarkened portions of the photomask block the second wavelength range of light from exposing corresponding portions of the photoresist on the product to be patterned, as also described in greater detail herein.

Since the photosensitive material darkens without any additional chemical assistance beyond the UV illumination described more fully herein, no additional chemical developing or etching is required to create a photomask using this material.

Having thus described the invention of the present application in detail and by reference to embodiments thereof, it will be apparent that modifications and variations are possible without departing from the scope of the invention defined in the appended claims.

What is claimed is:

1. A method of making a high resolution photomask comprising:
   providing a photomask substrate having a first major surface and a second major surface, the photomask substrate being sensitive to light within a first wavelength range and is initially transparent to light within a second wavelength range that is utilized for product exposure operations required to pattern a product through the photomask;
   exposing select regions of the first major surface of the photomask to light from a light source having light in at least the first wavelength range so as to selectively photodarken regions of the photomask substrate according to a desired pattern, the photodarkened regions darkened sufficient to block light within the second wavelength range; and
   providing a filter associated with the second major surface of the photomask substrate, the filter for:
   allowing light within the second wavelength range to pass through; and
   performing at least one of: inhibiting and reducing the rate at which, light within at least the first wavelength range, which is directed towards the second major surface, causes photodarkening of the photomask substrate.

2. The method according to claim 1, wherein providing a photomask substrate, comprises:
   utilizing a photosensitive polymer that is photodarkened by at least one wavelength of ultraviolet light.

3. The method according to claim 2, wherein utilizing a photosensitive polymer, comprises:
   utilizing a polymer substrate to define the photomask; and
   adding a photosensitive additive to the polymer substrate to enable the photomask to photodarken in response to exposure by the light within the first wavelength range.

4. The method according to claim 1, wherein providing a filter associated with the second major surface of the photomask substrate, comprises:
   applying a filtering additive to the second major surface of the photomask substrate to filter out the wavelengths of light that cause the photomask substrate to photodarken.

5. The method according to claim 1, further comprising:
   providing a second filter associated with the first major surface for inhibiting or otherwise reducing the rate at which light within the first wavelength range, which is directed towards the first major surface, causes photodarkening of the photomask substrate.

6. The method according to claim 1, wherein providing a photomask substrate further comprises:
   utilizing a select one of: a flexible material and a stretchable material, for use in contact lithography on compound curved surfaces in a manner that is capable of resolving images down to sub-micron levels and requires no chemical processing to create the pattern in the photomask.

7. The method according to claim 1, wherein exposing select regions of the first major surface of the photomask to light, comprises:
   utilizing a mask master;
   aligning the mask master with the first major surface of the photomask so that sensitive substrate regions are between the mask master and the filter associated with the second major surface of the photomask substrate; and
   utilizing the light source to emit the light at least within the first wavelength range through the mask master to selectively define the pattern in the photomask.

8. The method according to claim 1, wherein:
   exposing select regions of the first major surface of the photomask according to a desired pattern, comprises:
   illuminating the select regions of the photomask through a mask master using a light source such that no chemical processing is required to pattern the photomask.

9. The method according to claim 1, wherein:
   exposing select regions of the first major surface of the photomask to light from a light source having light within at least the first wavelength range so as to selectively photodarken regions, photodarkens regions that are internal to the photomask substrate.

10. The method according to claim 1, wherein:
    providing a filter associated with the second major surface of the photomask, comprises providing the filter as a layer over the photomask substrate.

11. A high resolution photomask comprising:
    a photomask substrate having a first major surface and a second major surface, the photomask substrate being sensitive to light within a first wavelength range and is initially transparent to light within a second wavelength range that is utilized for product exposure operations required to pattern a product through the photomask, wherein:
    exposure of select regions of the first major surface of the photomask to light from a light source having light within the first wavelength range, selectively photodarkens those regions of the photomask substrate, the photodarkened regions darkened sufficient to block light within the second wavelength range; and
    a filter associated with the second major surface of the photomask substrate that allows light within the second wavelength range to pass through, wherein the second performs at least one filtering function that:
    inhibits light within at least the first wavelength range, which is directed towards the second major surface, from causing photodarkening of the photomask substrate; and reduces the rate at which light within at least the first wavelength range, which is directed towards the second major surface, causes photodarkening within the photomask substrate.

12. The high resolution photomask according to claim 11, wherein:
the photomask substrate comprises a polymer that is stretchable.

13. The high resolution photomask according to claim 11, wherein:
the photomask substrate comprises a polymer that is flexible but not stretchable.

14. The high resolution photomask according to claim 11, wherein:
the photomask substrate comprises a rigid substrate.

15. The high resolution photomask according to claim 11, wherein:
the photomask substrate comprises a polymer that includes a photosensitive additive internal to the substrate, that provides the sensitivity to light within the first wavelength range.

16. A method of patterning a product using a high resolution photomask comprising:
providing a photomask substrate having a first major surface and a second major surface, the photomask substrate being sensitive to light within a first wavelength range and is initially transparent to light within a second wavelength range that is utilized for product exposure operations required to pattern a product through the photomask;
providing a filter associated with the second major surface of the photomask substrate that performs at least one of: inhibiting and reducing the rate at which, light within at least the first wavelength range, which is directed towards the second major surface, causes photodarkening of the photomask substrate;
positioning a mask master over the first major surface of the photomask such that the photomask substrate is between the mask master and the filter;
exposing select regions of the first major surface of the photomask through the mask master, to light from a light source having light within at least the first wavelength range so as to selectively photodarken regions of the photomask substrate according to a master pattern, the photodarkened regions darkened sufficient to block light within the second wavelength range;
providing a layer of photoresist over a product to be patterned;
aligning the photomask over the photoresist on the product to be patterned such that the first major surface of the photomask is between the filter of the photomask and the photoresist over the product to be patterned; and
exposing the photoresist on the product to be patterned to an exposure source that emits light within at least the second wavelength range, through the second major surface of the photomask, such that the filter of the photomask filters energy that would otherwise photodarken the sensitive regions the photomask, wherein:
the filter allows light within the second wavelength range, from the exposure source to pass through the second major surface of the photomask;
the non-photodarkened portions of the photomask are transmissive to the second wavelength range of light to selectively expose corresponding portions of the photoresist on the product according to the pattern in the photomask; and
the photodarkened portions of the photomask block the second wavelength range of light from exposing corresponding portions of the photoresist on the product to be patterned.

17. The method according to claim 16, further comprising:
adding a filter to the first major surface of the photomask after exposing select regions of the first major surface of the photomask through the mask master, and before using the photomask to pattern a product.

18. The method according to claim 16, wherein providing a photomask substrate, comprises:
utilizing a photosensitive polymer that is photodarkened by at least one wavelength of ultraviolet light.

19. The method according to claim 18, wherein utilizing a photosensitive polymer, comprises:
utilizing a polymer substrate to define the photomask; and
adding a photosensitive additive to the polymer substrate to enable the photomask to photodarken in response to exposure by the light within the first wavelength range.

20. The method according to claim 16, wherein providing a filter associated with the second major surface of the photomask substrate, comprises:
applying a filtering additive to the second major surface of the photomask substrate to filter out the wavelengths of light that cause the photomask substrate to photodarken.

* * * * *